United States Patent
Chan et al.

(10) Patent No.: US 8,513,698 B2
(45) Date of Patent: Aug. 20, 2013

(54) LED PACKAGE

(75) Inventors: Shiun-Wei Chan, Hsinchu (TW); Chih-Hsun Ke, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 213 days.

(21) Appl. No.: 13/172,845

(22) Filed: Jun. 30, 2011

(65) Prior Publication Data

US 2012/0098021 A1    Apr. 26, 2012

(30) Foreign Application Priority Data

Oct. 20, 2010  (CN) .......................... 2010 1 0513026

(51) Int. Cl.
    *H01L 33/00*    (2010.01)
(52) U.S. Cl.
    USPC  257/99; 257/100; 257/E33.058; 257/E33.059; 257/E33.062; 257/E33.064; 257/E33.065
(58) Field of Classification Search
    USPC .................. 257/99, 100, E33.058, E33.059, 257/E33.062, E33.064, E33.065
    See application file for complete search history.

(56) References Cited

U.S. PATENT DOCUMENTS

| | | | |
|---|---|---|---|
| 8,338,842 B2 * | 12/2012 | Lerman et al. ................. | 257/88 |
| 2008/0191237 A1 * | 8/2008 | Andrews ....................... | 257/100 |
| 2010/0019247 A1 * | 1/2010 | Joichi et al. .................... | 257/76 |
| 2010/0032705 A1 * | 2/2010 | Shin et al. ...................... | 257/99 |
| 2010/0203658 A1 * | 8/2010 | Aida et al. ..................... | 438/27 |
| 2012/0068218 A1 * | 3/2012 | Chang et al. ................... | 257/99 |

* cited by examiner

*Primary Examiner* — Victor A Mandala
(74) *Attorney, Agent, or Firm* — Altis Law Group, Inc.

(57) ABSTRACT

An LED package includes a substrate, an LED chip and an encapsulation. The substrate includes a main plate, and a first soldering pad and a second soldering pad attached to the main plate. The first soldering pad and the second soldering pad are separated from each other. The LED chip includes a first electrode and a second electrode. The LED chip is mounted on the substrate with the second electrode electrically connected to the second soldering pad of the substrate. The encapsulation includes a main body enclosing the LED chip and an electric connecting unit electrically connecting the first electrode of the LED chip and the first soldering pad.

10 Claims, 2 Drawing Sheets

LED PACKAGE

BACKGROUND

1. Technical Field

The present disclosure relates to semiconductor packages, and particularly to an LED (light emitting diode) package with improved working stability and reliability.

2. Description of the Related Art

Typically, an LED package includes a substrate, an LED chip mounted on the substrate, and an encapsulation enclosing the LED chip. The LED chip includes a pair of electrodes electrically connecting to outer electrodes via gold wires. To firmly secure the gold wires to the LED chip, glue is usually used.

However, the glue needs a long period of time to be cured before the gold wires/LED chip combination can be in the subsequent encapsulation process, which causes the manufacturing of the LED package to have a high cost and low efficiency. Furthermore, during the encapsulation process or use of the LED package, the connections between the gold wires and the LED chip are easily to break, resulting in that the LED package can not work normally, which severely affects the work stability and reliability of the LED package. What is desired, therefore, is an LED package which can overcome the above-described shortcomings.

DETAILED DESCRIPTION

Embodiments of an LED package as disclosed are described in detail here with reference to the drawings.

Figure 1:
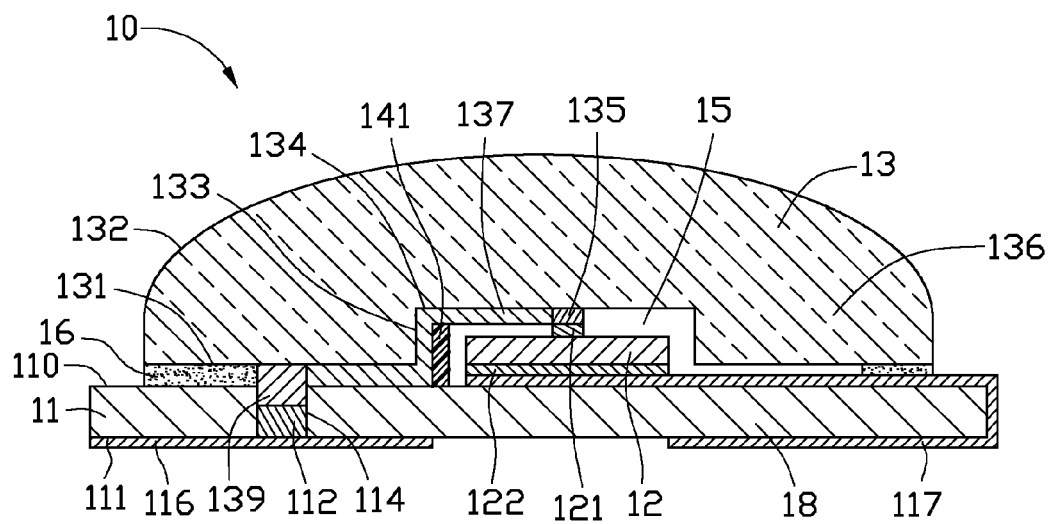
FIG. 1 is a cross section of an LED package in accordance with a first exemplary embodiment of present disclosure.

Referring to FIG. 1, an LED package 10 according to a first exemplary embodiment is shown. The LED package 10 includes a substrate 11, an LED chip 12 and an encapsulation 13.

The substrate 11 is made of thermally conductive and electrically insulating material such as epoxy, silicone, silicon oxide or a mixture thereof. The substrate 11 includes a main plate 118, and a first soldering pad 116 and a second soldering pad 117 mounted at two opposite lateral sides of the main plate 118, respectively. The substrate 11 includes a top surface 110 and a bottom surface 111 opposite to the top surface 110. A locating hole 114 extends through the substrate 11 along a height direction of the substrate 11 from the top surface 110 to the bottom surface 111.

The first soldering pad 116 is flat, and directly attached to the bottom surface 111 of the substrate 11. The first soldering pad 116 seals a bottom end of the locating hole 114. The second soldering pad 117 is substantially U-shaped, and has a first section contacting the top surface 110 of the substrate 11, a second section contacting a side surface of the substrate 11 and a third section contacting the bottom surface 111 of the substrate 11. The first soldering pad 116 and the second soldering pad 117 are separated from each other.

The LED chip 12 includes a first electrode 121 located at a top side thereof and a second electrode 122 located at a bottom side thereof. The LED chip 12 is mounted on the top surface 110 of the substrate 11 with the second electrode 122 directly contacting the first section of the second soldering pad 117. The second electrode 122 of the LED chip 12 is electrically connected with the second soldering pad 117 of the substrate 11 by soldering.

The encapsulation 13 is made of transparent material or semi-transparent material. The encapsulation 13 includes a main body 136 and an electric connecting unit connected between the first electrode 121 of the LED chip 12 and the first soldering pad 116 of the substrate 11. The main body 136 includes an annular planar mounting surface 131 facing and adjacent to the substrate 11, a convex light exit surface 132 connected to an outer periphery of the mounting surface 131 and a light incident surface 134 connected to an inner periphery of the mounting surface 131. The light incident surface 134 is concaved from the inner periphery of the planar mounting surface 131 towards the light exit surface 132. A rectangular receiving room 133 surrounded by the light incident surface 134 is defined in the middle of a bottom of the encapsulation 13. The encapsulation 13 includes fluorescent powder, such as YAG, TAG, silicate, nitride, nitrogen oxides, phosphide or sulfide distributed evenly in an interior thereof. The fluorescent powder is used for changing color of light from the LED chip 12 into a different color. Alternatively, the fluorescent powder can be layered on the light exit surface 132 of the encapsulation 13.

The electric connecting unit includes an electric pole 135 located at a middle portion of the light incident surface 134, an electric conduction block 139 interferentially received in an upper portion of the locating hole 114 of the substrate 11, and a transparent electric conduction layer 137 interconnecting the electric pole 135 and the electric conduction block 139. The electric conduction layer 137 covers a portion of the light incident surface 134 and a portion of the mounting surface 131 of the encapsulation 13. The electric conduction layer 137 is made of a layer of transparent and electrically conductive material, such as transparent metal, indium tin oxide or carbon nano-tubes. The transparent conductive layer 137 can be formed on the encapsulation 13 by electroplating, chemical plating, sputtering, electron beam evaporation or other known methods.

The encapsulation 13 is fixedly mounted on the substrate 11 with the mounting surface 131 connected an outer portion of the top surface 110 of the substrate 11. The LED chip 12 is received in the receiving room 133 of the encapsulation 13. A hermetical material 16 is filled in an outer portion of a clearance defined between the mounting surface 131 of the encapsulation 13 and the top surface 110 of the substrate 11. The hermetical material 16 encloses the LED chip 12 for sealing the LED chip 12 between the encapsulation 13 and the substrate 11, to protect the LED chip 12 from foreign articles such as moisture, dust or water.

An electric conduction post 112 is received in a lower portion of the locating hole 114 of the substrate 11 for electrically interconnecting the electric conduction block 139 of the encapsulation 13 and the first soldering pad 116 of the substrate 11. The electric conduction post 112 is formed by filling electric conductive material in the locating hole 114 from a bottom side of the substrate 11 after the electric conduction block 139 is interferentially inserted into the upper portion of the locating hole 114.

The LED chip 12 is mounted on the substrate 11 with the second electrode 122 connecting with the first section of the second soldering pad 117. The LED chip 12 is received in the receiving room 133 of the encapsulation 13 and spaced apart from the light incident surface 134 of the encapsulation 13 to define a space 15 therebetween. The electric pole 135 of the encapsulation 13 connects the first electrode 121 of the LED chip 12 via eutectic combination. An electrically insulating layer 141 is located between the electric conduction layer 137 and the LED chip 12.

In summary, the LED package 10 includes the encapsulation 13 with the electric pole 135 formed thereon, and the electric pole 135 directly connects the first electrode 121 of the LED chip 12 to omit the use of a gold wire therebetween. Thus, glue for connecting the gold wires and the electrodes of the LED chips together is not necessary during manufacturing of the LED package 10, which results in that the manufacturing of the LED package 10 has a lower cost and high efficiency. Furthermore, the electric pole 135 of the encapsulation 13 and the first electrode 121 of the LED chip 12 are connected together via eutectic bonding, which can provide improved working stability and reliability of the LED package 10.

Figure 2:
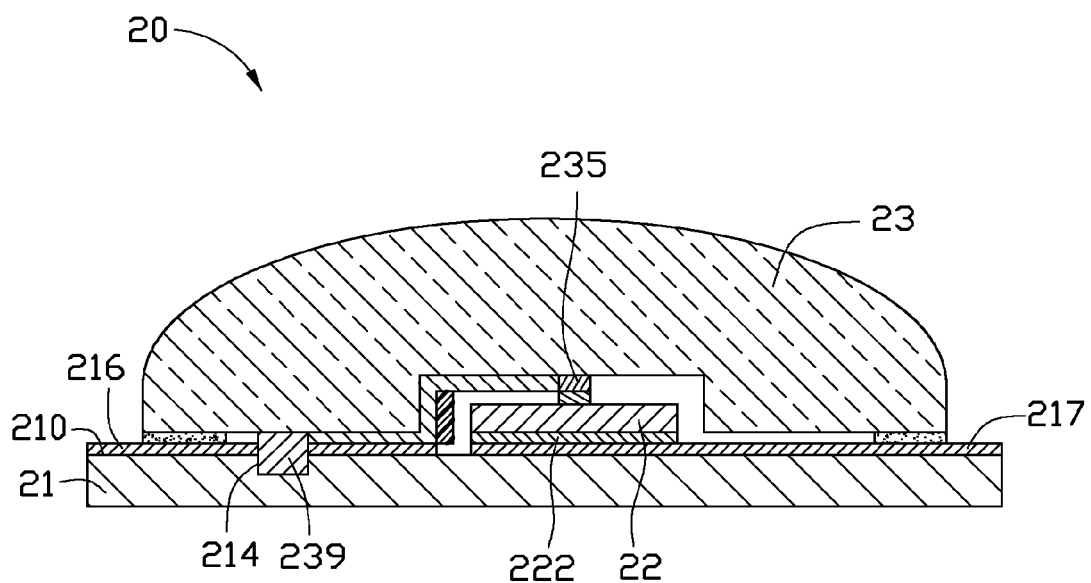
FIG. 2 is a cross section of an LED package in accordance with a second exemplary embodiment of present disclosure.

Referring to FIG. 2, an LED package 20 in accordance with a second embodiment of the disclosure is illustrated. The LED package 20 differs from the previous embodiment only in that the locating hole 214 of the substrate 21 is a blind hole, and the substrate 21 includes a flat first soldering pad 216 and a flat second soldering pad 217 arranged at two opposite sides of the top surface 210 of the substrate 21, respectively. The electric conduction block 239 of the encapsulation 23 is interferentially inserted in the locating hole 214 of the substrate 21. The first soldering pad 216 is mounted around the electric conduction block 239, and electrically connected to the electric conduction block 239 by soldering. The second electrode 222 of the LED chip 22 directly contacts the second soldering pad 217 of the substrate 21 and connects the second soldering pad 217 of the substrate 21 by eutectic bonding.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. An LED package, comprising:
    a substrate comprising a main plate, and a first soldering pad and a second soldering pad attached to the main plate, the first soldering pad and the second soldering pad being separated from each other;
    an LED chip comprising a first electrode and a second electrode, the LED chip mounted on the substrate with the second electrode electrically connected to the second soldering pad of the substrate; and
    an encapsulation comprising a main body enclosing the LED chip and an electric connecting unit electrically connecting the first electrode of the LED chip and the first soldering pad, the electric connecting unit comprising an electric pole aligned with the first electrode of the LED chip and directly contacting the first electrode of the LED chip;
    wherein the main plate of the substrate defines a locating hole therein, the electric connecting unit comprising an electric conduction block received in the locating hole and an electric conduction layer electrically connected between the electric pole and the electric conduction block, the electric conduction block electrically connecting with the first soldering pad; and
    wherein the locating hole extends through the substrate along a height direction of the substrate, the first soldering pad covering a bottom side of the locating hole, the electric conduction block being received in an upper portion of the locating hole, an electric conduction post being received in a lower portion of the locating hole, the electric conduction post electrically interconnecting the electric conduction block and the first soldering pad of the substrate.

2. The LED package of claim 1, wherein the encapsulation comprises an annular mounting surface, a light exit surface connected an outer periphery of the mounting surface and a light incident surface connected an inner periphery of the mounting surface, the light incident surface concaved from the inner periphery of the mounting surface towards the light exit surface to define a receiving room enclosed by the light incident surface, the LED chip being received in the receiving room, the electric pole mounted on the light incident surface.

3. The LED package of claim 1, wherein the electric pole of the encapsulation and the first electrode of the LED chip are connected together via eutectic bonding.

4. The LED package of claim 1, wherein the electric conduction layer is made of electrically conductive and transparent material.

5. The LED package of claim 4, wherein the electric conductive layer is made of one of following materials: transparent metal, indium tin oxide and carbon nano-tubes.

6. The LED package of claim 1, wherein an insulation layer is formed between the electric conductive layer and the LED chip.

7. An LED package, comprising:
    a substrate comprising a main plate, and a first soldering pad and a second soldering pad formed on the main plate, the first soldering pad and the second soldering pad being separated from each other;
    an LED chip mounted on the substrate, the LED chip comprising an electrode formed on a surface thereof farthest away from the substrate; and
    an encapsulation enclosing the LED chip, the encapsulation comprising an electric connecting unit electrically connecting the electrode of the LED chip and the first soldering pad, the electric connecting unit comprising an electric pole aligned with the electrode of the LED chip and directly connecting with the electrode of the LED chip, the encapsulation comprising an annular mounting surface, a light exit surface connected an outer periphery of the mounting surface and a light incident surface connected an inner periphery of the mounting surface;
    wherein the light incident surface is concaved from the inner periphery of the mounting surface towards the light exit surface to define a receiving room enclosed by the light incident surface, the LED chip being received in the receiving room, the electric pole mounted on the light incident surface;
    wherein the main plate of the substrate defines a locating hole therein, the electric connecting unit comprising an electric conduction block received in the locating hole and an electric conduction layer electrically connected between the electric pole and the electric conduction block, the electric conduction block electrically connecting with the first soldering pad; and
    wherein the locating hole extends through the substrate along a height direction of the substrate, the first soldering pad sealed a bottom side of the locating hole, the electric conduction block being received in an upper portion of the locating hole, an electric conduction post being received in a lower portion of the locating hole, the electric conduction post electrically connecting the electric conduction block and the first soldering pad of the substrate.

8. The LED package of claim 7, wherein the LED chip further comprises another electrode electrically connected to the second soldering pad.

9. The LED package of claim 8, wherein the LED chip is arranged on the second soldering pad, and the another electrode is formed on a side of the LED package facing the substrate and directly connects the second soldering pad.

10. The LED package of claim 7, wherein the electric pole of the encapsulation and the electrode of the LED chip are connected together via eutectic bonding.

* * * * *